United States Patent [19]

Yabuki et al.

[11] Patent Number: 5,250,910
[45] Date of Patent: Oct. 5, 1993

[54] PUSH-PUSH OSCILLATOR HAVING IN-PHASE AND ANTI-PHASE OUTPUT COMBINING CIRCUITS

[75] Inventors: Hiroyuki Yabuki, Kawasaki; Isao Ishigaki, Kouriyama; Mitsuo Makimoto, Yokohama, all of Japan

[73] Assignee: Matsushita Electric Industrial Co., Ltd., Osaka, Japan

[21] Appl. No.: 925,158

[22] Filed: Aug. 6, 1992

[30] Foreign Application Priority Data

Aug. 12, 1991 [JP] Japan .................. 3-201681
Dec. 6, 1991 [JP] Japan .................. 3-322695

[51] Int. Cl.⁵ .................................... H03B 5/18
[52] U.S. Cl. ........................... 331/56; 331/60; 331/76; 331/100; 331/114; 331/117 D
[58] Field of Search ............ 331/56, 96, 99, 100, 331/102, 107 SL, 114, 117 D, 45, 60, 74, 76

[56] References Cited

U.S. PATENT DOCUMENTS

| 4,749,963 | 6/1988 | Makimoto et al. ............ 331/99 |
| 4,763,084 | 8/1988 | Pavio et al. ............... 331/56 |

FOREIGN PATENT DOCUMENTS

| 0074687 | 3/1983 | European Pat. Off. . |
| 0085241 | 8/1983 | European Pat. Off. . |
| 0247749 | 12/1987 | European Pat. Off. . |
| 0250301 | 12/1987 | European Pat. Off. . |
| 2245784 | 1/1992 | United Kingdom . |

OTHER PUBLICATIONS

"Balanced vco with ring resonator" by J. Suarez, Motorola Technical Developments, vol. 13, Jul. 1991, p. 90.

*Primary Examiner*—Siegfried H. Grimm
*Attorney, Agent, or Firm*—Lowe, Price, LeBlanc & Becker

[57] ABSTRACT

A push-push oscillator including a resonator having a transmission line and a capacitance connected to the transmission line in parallel; an oscillating circuit responsive to the resonator for oscillating and for producing first and second outputs having an antiphase relation therebetween; an in-phase combining circuit for summing the first and second outputs of said oscillating circuit to produce a summed signal; and an antiphase combining circuit responsive to two components from the resonator having an antiphase relation for producing a differential signal in accordance with a difference between the two components. Alternatively, the in-phase combining circuit is connected to the resonator and the antiphase combining circuit is connected to the oscillating circuit. The antiphase combining circuit outputs a fundamental wave component of the resonator. The in-phase combining circuit outputs a second harmonic wave component. When this push-push oscillator is used in a PLL circuit to form a frequency synthesizer, a high frequency output is obtained with a low power consumption.

23 Claims, 7 Drawing Sheets

$Zs^2 = Zpe \cdot Zpo$ $Zs^2 > Zpe \cdot Zpo$

PUSH-PUSH OSCILLATOR HAVING IN-PHASE AND ANTI-PHASE OUTPUT COMBINING CIRCUITS

BACKGROUND OF THE INVENTION

1. Field of the Invention

This invention relates to a push-push oscillator, and particularly to a push-push oscillator for high-frequency radio, communication, and measuring apparatus.

2. Description of the Prior Art

A prior art TEM mode resonator is frequently used for a high-frequency miniaturized resonator comprising an open-end half-wave resonator and U-shaped resonator. FIG. 15 shows an example of a prior art open end half-wave resonator comprising a resonating transmission line 101. FIG. 16 shows a prior art resonator 102 formed into U-shape by bending the resonating transmission line.

A prior art push-push oscillator using the above-mentioned resonator as a high-frequency oscillator is frequently used, which is described in U.S. Pat. No. 4,763,084.

FIG. 17 shows a schematic circuit diagram of such prior art push-push oscillator. The push-push oscillator comprises a resonating portion 103, an oscillating portion 104 including two symmetric oscillators such as a Colpitts oscillator, whose two outputs have a phase difference of 180° with each other, and a combining circuit 105 including transmission lines having the same electrical lengths for cancelling fundamental harmonic components and odd-order harmonic components and doubling only even-order harmonic components.

However, there is a problem that the size of the resonator 103 cannot be reduced because an area used for the resonator 103 is large to obtain a desired resonance frequency. This is because in the prior art resonator 103, the length of the resonator 103 is a half-wave which is large.

Moreover, if the oscillator mentioned above is used in a phase-locked loop circuit to form a frequency synthesizer, a divider for dividing the output frequency directly is necessary. However, there is a problem the higher the frequency of the divider capable of high speed operation the more increases the power consumption.

SUMMARY OF THE INVENTION

The present invention has been developed in order to remove the above-described drawbacks inherent to the conventional push-push oscillator.

According to the present invention there is provided a push-push oscillator comprising: a resonator having transmission line and a capacitance connected to the transmission line in parallel; an oscillating circuit responsive to the resonator for oscillating and for producing first and second outputs having an antiphase relation therebetween; an in-phase combining circuit for summing the first and second outputs of the oscillating circuit to produce a summed signal; and an antiphase combining circuit responsive to two components from the resonator having an antiphase relation for producing a differential signal in accordance with the difference between the two components.

The transmission line may be made of a dielectric material and is so curved to form an open loop whose both ends are connected to a capacitance. The resonator may further comprise two second transmission lines, each provided to each end of the transmission line, these two second transmission lines facing each other with a given distance therebetween, the distance and length of the second transmission lines being determined such that necessary capacitance is provided. Impedance of each portion of the resonator is changed stepwise to miniaturize the resonator. The antiphase combining circuit is formed as follows:

The transmission line of the resonator has a straight line portion including a virtual ground point of the transmission line and the antiphase combining circuit comprises a second strip line arranged in parallel to the straight line, the second strip line being arranged such that the virtual ground divides the second strip line into two portions having electrical lengths which is equal to each other.

According to the present invention there is also provided a push-push oscillator comprising: a resonator having transmission line and a capacitance connected to the transmission line in parallel; an oscillating circuit responsive to the resonator for oscillating and for producing first and second outputs having an antiphase relation therebetween; and antiphase combining circuit responsive to first and second outputs for producing a differential signal in accordance with difference between the first and second outputs; and an in-phase combining circuit responsive to two components from the resonator having an antiphase relation for summing the two components. The antiphase combining circuit comprises a balance to unbalance converting circuit.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Hereinbelow will be described a first embodiment of this invention of a push-push oscillator with reference to FIG. 1.

Figure 1:
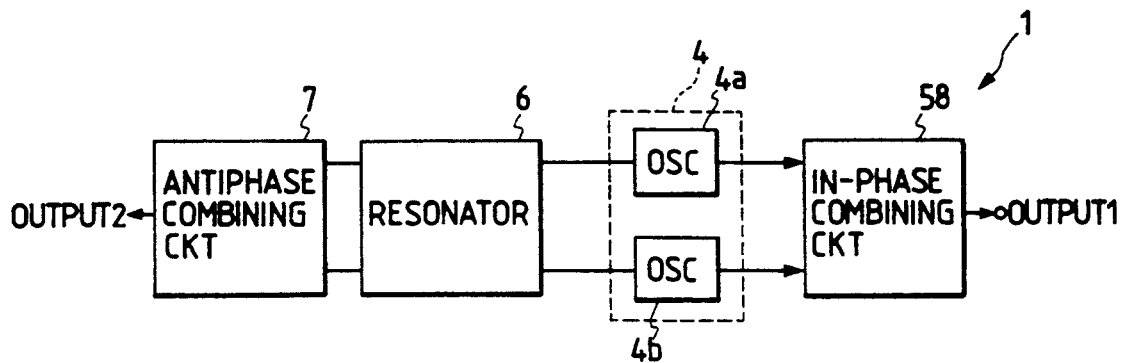
FIG. 1 is a block diagram of a first embodiment of a push-push oscillator.

FIG. 1 is a block diagram of a push-push oscillator of the first embodiment comprising: a resonator 6, an oscillating portion 4, an antiphase combining circuit 7 for combining resonator's outputs having antiphase relation, and an in-phase combining circuit 58 combining oscillating portion's outputs having in-phase relation.

Figure 6:
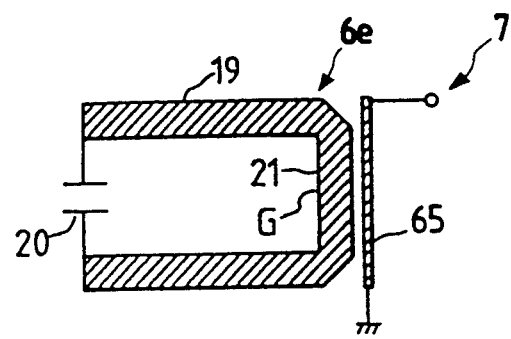
FIG. 6 shows a configuration of the antiphase combining circuit of the first embodiment.
Figure 7:
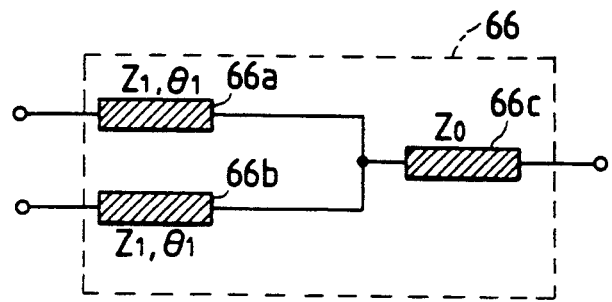
FIG. 7 shows a configuration of an example of an in-phase combining circuit used in the first embodiment of this invention.
Figure 8:
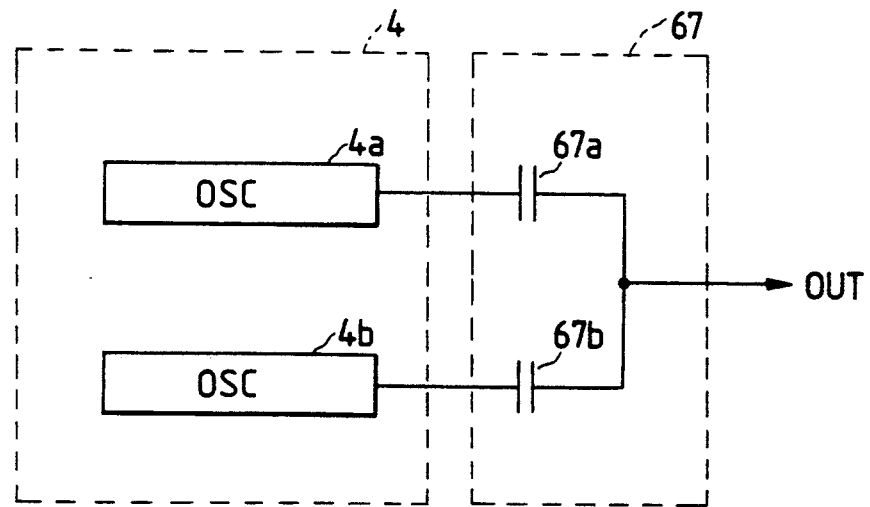
FIG. 8 shows a schematic drawing of an example of an in-phase combining circuit of the first embodiment.

FIGS. 2-5 show various configurations of the resonator 6. FIG. 6 shows a configuration of an antiphase combining circuit 7. FIGS. 7 and 8 show examples of configurations of the in-phase combining circuit 58.

The length of a resonator can be reduced by providing a gap in an annular transmission line (strip line or micro strip line) and a capacitor connected to both ends of the transmission line. The transmission line comprises a strip line. The term "strip line" includes a microstrip line and balanced strip line in addition to a strip line throughout the specification and the claims.

Figure 2:
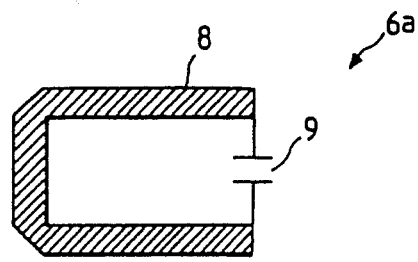
FIG. 2 shows an example of a resonator used in the first and second embodiments of this invention.

FIG. 2 shows an example of a resonator 6 used in the first and second embodiments of this invention. In FIG. 2, a first resonator 6a comprises an annular transmission line 8 having a gap to which a lumped element capacitance, or capacitor 9 is connected. That is, the transmission line 8 is formed a substantially complete loop having a gap whose both ends are connected to a capacitor 9.

Figure 3:
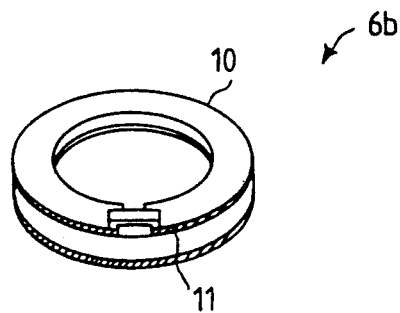
FIG. 3 shows a second resonator used in the first and second embodiments of this invention.

FIG. 3 shows a second resonator 6b used in the first and second embodiments of this invention comprising an annular dielectric 10 having a gap to which a lumped element capacitance 11 is connected. In other words, an open loop whose both ends are connected to a capacitance 11.

Figure 4:
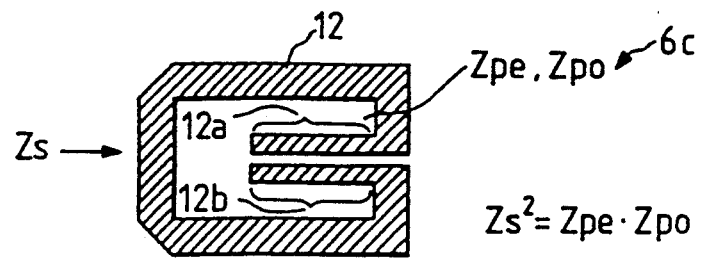
FIG. 4 shows a third resonator used in the first and second embodiment of this invention.

FIG. 4 shows a third resonator 6c used in the first and second embodiment of this invention, comprising an essentially annular transmission line 12 having coupled transmission lines 12a and 12b.

Assuming that an impedance of the annular transmission line 12 is $Z_{s1}$, an even mode impedance of the coupled transmission lines 12a and 12b is $Z_{pe1}$, and an odd mode impedance is $Z_{po1}$, each dimension of the third resonator 6c is determined in accordance with $Z_{s1}^2 = Z_{pe1} \cdot Z_{po1}$.

Figure 5:
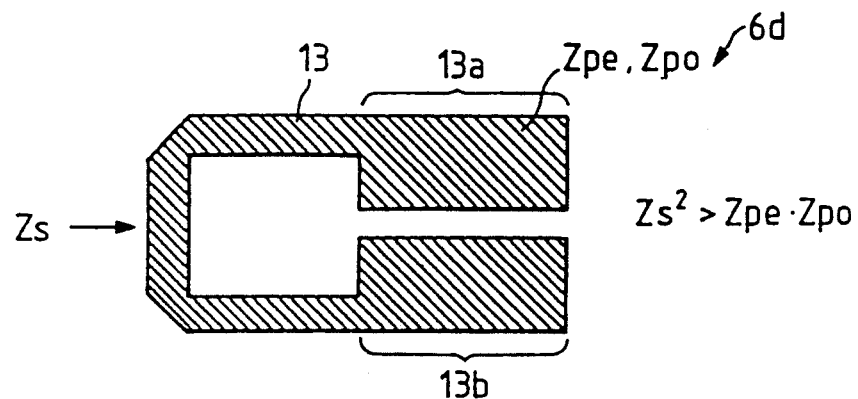
FIG. 5 shows a fourth resonator used in the first and second embodiments of this invention.

FIG. 5 shows a fourth resonator 6d used in the first and second embodiments of this invention, comprising coupled lines 13a and 13b and U-shaped transmission line 13 whose impedance is changed stepwise from the coupled lines 13a and 13b. It is assumed that the impedance of the U-shaped transmission line 13 is $Z_{s2}$, an even mode impedance of the coupled transmission lines 13a and 13b is $Z_{pe2}$, and an odd mode impedance is $Z_{po2}$. The length of the fourth resonator 6d can be further decreased, compared with the third resonator shown in FIG. 4 by determining each dimensions of the resonator 6d in accordance with $Z_{s2}^2 > Z_{pe2} \cdot Z_{po2}$.

According to the above-mentioned structure, a miniaturized resonator 6 whose output signals at both ends have a phase difference of 180° at the resonance frequency is formed.

Coupling between the resonator 6 and the oscillator 4a or 4b is effected by capacitive coupling at an end of the U-shaped resonator or by electro-magnetic coupling at a corner of the U-shaped resonator. Phase relation at a pair of outputs of the resonator is dependent on the location of the coupling. Therefore, suitable coupling portions are selected. Outputs of the resonator 6 to the oscillators 4a and 4b have antiphase relation therebetween.

The oscillating portion 4 has two well-known oscillators 4a and 4b, such as a Colpitts oscillator, which have the same circuit structure with each other and are arranged symmetrically. Therefore, outputs of those oscillators 4a and 4b have 180° phase difference therebetween.

Two outputs from the oscillating portion 4 have a phase difference of 180° therebetween. Therefore, if in-phase combining is effected to the outputs of the oscillating portion 4, the fundamental wave components cancel each other and second harmonics wave components are doubled. On the other hand if antiphase combining is effected to the outputs of the oscillating portion 4, the second harmonic wave components cancel each other and fundamental components are doubled. In this embodiment, the outputs of the oscillating portion 4 are in-phase combined, so that the second harmonic wave component is obtained from the in-phase combining circuit.

FIG. 6 shows a configuration of the antiphase combining circuit 7 of the first embodiment. This antiphase combining circuit 7 comprises a U-shaped transmission line whose both ends are capacitively coupled and a second transmission line 65 arranged parallel to the bottom portion 21 of the U-shaped transmission line. The transmission line 19 acts as a resonator also. The middle point of the bottom portion 21 is a virtual ground. The transmission line 65 being formed such that the virtual ground divides the second strip line 65 into two portions having electrical lengths which are equal to each other. One end of the second transmission line 65 is grounded. Its output is obtained at the other end of the second transmission line 65.

FIG. 7 shows a configuration of an example of an in-phase combining circuit 66 used in the first and second embodiments of this invention. The in-phase combining circuit 66 comprises transmission lines 66a and 66b having the same electrical length $\theta 1$ and the same impedance Z1. The strip line 66c is for impedance matching to the following stage.

FIG. 8 shows a schematic drawing of an example of an in-phase combining circuit 67 of the first embodiment. The outputs of the oscillating portion 4 are directly connected through capacitors 67a and 67b. That is, the outputs of the oscillating portion 4 are connected to one end of respective capacitors 67a and 67b having the same small capacitance The other ends of the capacitors 67a and 67b are connected to each other and the output is obtained therefrom. Isolation between both oscillation portions 4a and 4b can be maintained because the capacitance is considerably small.

As mentioned above, according to this embodiment, the push-push oscillator comprises the resonator 6 having a capacitance for resonance and a transmission line connected to the capacitance in parallel, the oscillating portion 4 having two oscillators 4a and 4b having the same structure arranged symmetrically, the in-phase combining circuit 58 for in-phase-combining two outputs of the oscillating portion 4 having antiphase relation, and the antiphase combining circuit 7 for antiphase-combining two outputs of the resonator 6 having antiphase relation. The antiphase combining circuit 7 is coupled to the resonator 6 and the in-phase combining circuit 58 is connected to the oscillating portion 4, so that a length of the resonator is made considerably smaller than that of the half-wave resonator. Moreover, if this oscillator mentioned above is used in a phase locked loop circuit to form a frequency synthesizer, there is provided a second harmonic output in addition to a fundamental frequency output, so that the power consumption of the frequency synthesizer can be reduced.

Hereinbelow will be described a second embodiment with reference to drawings.

Figure 9:
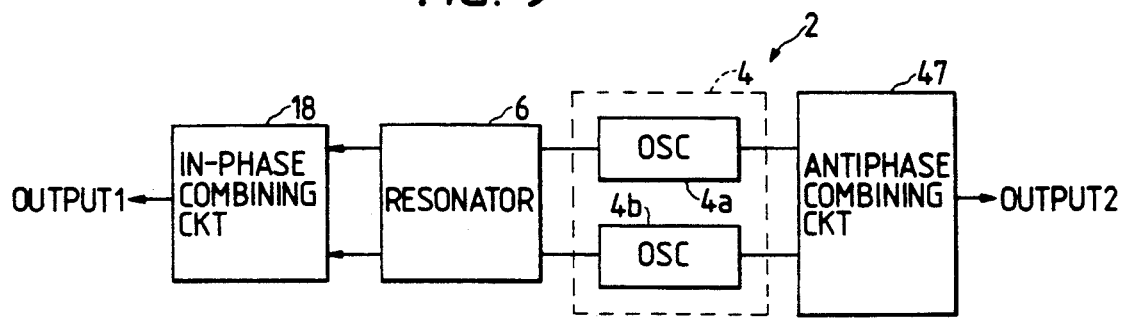
FIG. 9 is block diagram of the second embodiment of the invention of a push-push oscillator.

FIG. 9 is block diagram of the second embodiment of the invention of a push-push oscillator. In FIG. 9, the push-push oscillator of the second embodiment comprises: a resonator 6, the oscillating portion 4, an antiphase combining circuit 47 as differential means for antiphase-combining oscillator's outputs having antiphase relation, and an in-phase combining circuit 18 in-phase-combining outputs of the resonator 6 having antiphase relation. The structures of the oscillating portion 4 and the resonator 6 are the same as those of the first embodiment respectively. Thus, a detailed description is omitted.

Figure 10:
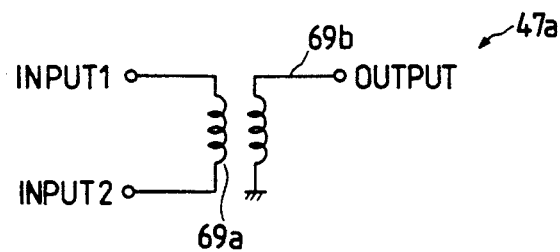
FIG. 10 shows a balance-unbalanced converting circuit of the second embodiment.

FIG. 10 shows a balance-unbalanced converting circuit 47a of the second embodiment as a such antiphase combining circuit of the push-push oscillator shown in FIG. 9 for combing two inputs such that two in-phase components cancel each other and two antiphase components are doubled in amplitude. A first antiphase combing circuit 47a comprises a first coil 69a, whose one end is supplied with a first input INPUT1 and whose another end is supplied with a second input INPUT2, and a second coil 69b whose one end is grounded and an output appears at another end.

Figure 11:
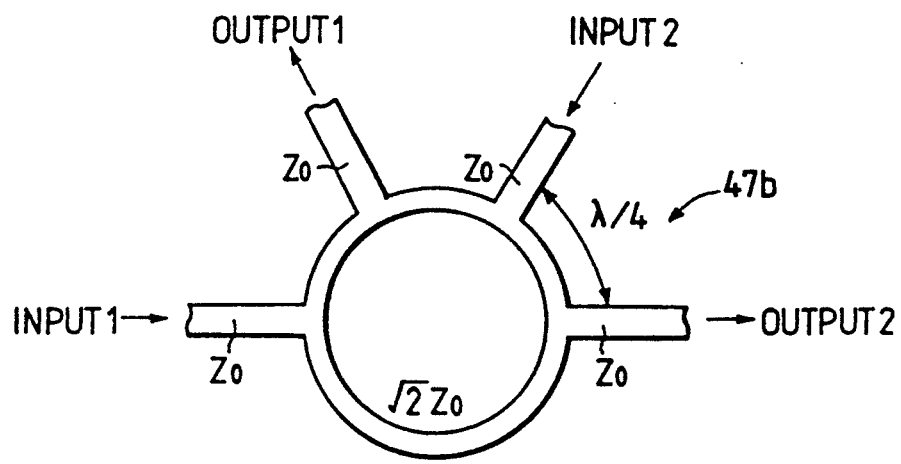
FIG. 11 shows a rat race circuit as a second antiphase combining circuit of the second embodiment.

FIG. 11 shows a rat race circuit 47b as a second antiphase combining circuit 47 of the second embodiment of the push-push oscillator shown in FIG. 9. The antiphase combining circuit 47b produces a differential signal in accordance with difference between input signals INPUT1 and INPUT2.

Figure 12:
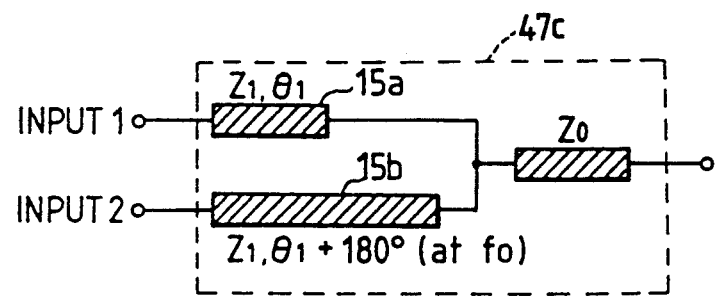
FIG. 12 shows a third antiphase combining circuit of the second embodiment.

FIG. 12 shows a third antiphase combining circuit 47c of the second embodiment comprising transmission lines 15a and 15b having a phase difference of 180° in electrical length at a resonance frequency of the resonator for producing the differential signal between two input signals INPUT1 and INPUT2.

Figure 13:
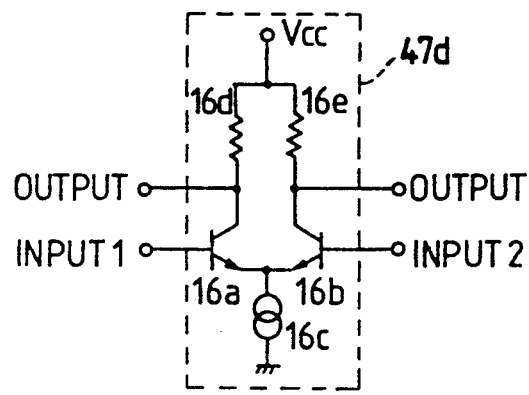
FIG. 13 shows a fourth antiphase combining circuit of the second embodiment.

FIG. 13 shows a differential amplifier of the second embodiment as an antiphase combining circuit 47d, comprising a pair of transistors 16a and 16b, a constant current source 16c, and resistors 16d and 16e. The pair of transistors 16a and 16b amplify the difference between two inputs INPUT1 and INPUT2 to produce two outputs in order to effect antiphase-combining.

Figure 14A:
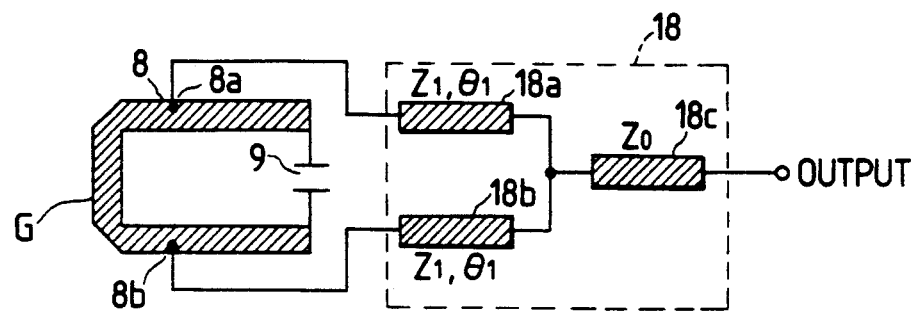
FIG. 14A shows a schematic drawing of an example of an in-phase combining circuit of the second embodiment of the push-push oscillator.

FIG. 14A shows a schematic drawing of an example of an in-phase combining circuit 18 of the second embodiment of the push-push oscillator. The in-phase combining circuit 18 comprises transmission lines 18a and 18b having the same electrical length $\theta 1$ and the same impedance Z1 as shown in FIG. 14A. The transmission lines 18a and 18b are connected to two output points of the resonator 8 respectively. The two output points are provided symmetrically with respect to a virtual ground G of the resonator 8 at the same electrical length from said virtual ground G.

When this oscillator mentioned above is used in a phase synchronizing circuit to form a frequency synthesizer, there is provided a high frequency output and the power consumption can be reduced.

Figure 14B:
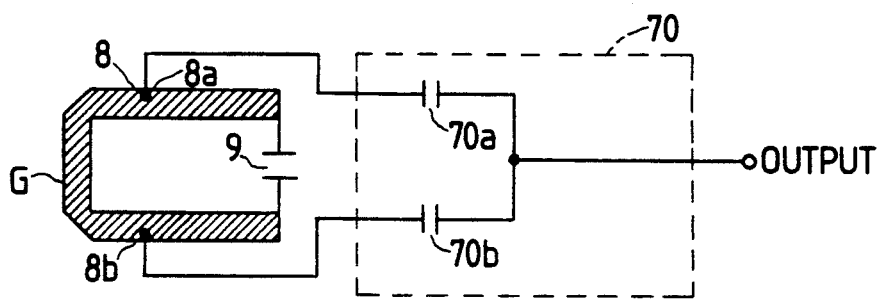
FIG. 14B shows a schematic drawing of an example of an in-phase combining circuit.
Figure 15:
FIG. 15 shows a prior art open end half-wave resonator comprising a resonating transmission line.
Figure 16:
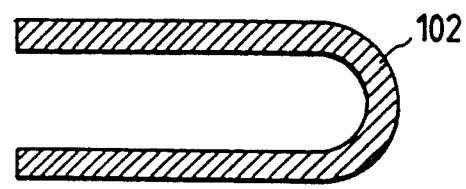
FIG. 16 shows a prior art resonator formed into U-shape by bending the resonating transmission line.
Figure 17:
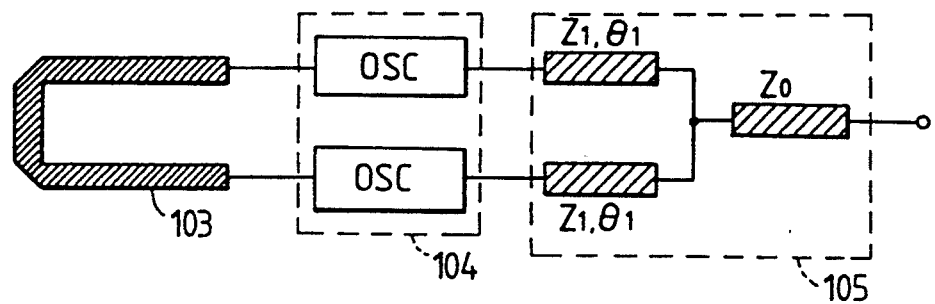
FIG. 17 shows a schematic circuit diagram of such prior art push-push oscillator.

FIG. 14B shows a schematic drawing of an example of an in-phase combining circuit 70 of the second embodiment of the push-push oscillator. Two output points 8a and 8b of the resonator 8 are connected through capacitors 70a and 70b to an output terminal. That is, two output points 8a and 8b of the resonator 8 are connected to one end of respective capacitors 70a and 70b having the same small capacitance. The other ends of the capacitors 70a and 70b are connected to each other and the output is obtained therefrom. Isolation between both output points 8a and 8b of the resonator 8 can be maintained because the capacitance is considerably small. The two output points 8a and 8b are provided symmetrically with respect to a virtual ground G of the resonator 8 at the same electrical length from said virtual ground G.

When this oscillator mentioned above is used in a phase locked loop circuit to form a frequency synthesizer, there is provided a high frequency output and the power consumption can be reduced.

What is claimed is:

1. A push-push oscillator comprising:
   (a) a resonator having a transmission line and a capacitance connected to said transmission line in parallel;
   (b) oscillating means responsive to said resonator for oscillating and for producing first and second outputs having an antiphase relation therebetween;
   (c) in-phase combining means for summing said first and second outputs of said oscillating means to produce a summed signal; and
   (d) antiphase combining means responsive to two components from said resonator having an antiphase relation for producing a differential signal in accordance with a difference between said two components.

2. A push-push oscillator as claimed in claim 1, wherein said transmission line is curved to form an open loop.

3. A push-push oscillator as claimed in claim 1, wherein said transmission line comprises a strip line.

4. A push-push oscillator as claimed in claim 1, wherein said transmission line is made of a dielectric material and is curved to form an open loop.

5. A push-push oscillator as claimed in claim 2, wherein said capacitance comprises two second transmission lines, each connected to a different end of said transmission line, said two second transmission lines facing each other with a given distance therebetween, said distance and length of said second transmission lines being determined such that necessary capacitance is provided.

6. A push-push oscillator as claimed in claim 1, wherein said transmission line comprises a substantially U-shaped strip line and said capacitance comprises two second transmission lines formed to have larger width than said U-shaped strip line, each connected to a different end of said U-shaped strip line, said two second transmission lines facing each other with a given distance therebetween, said distance and length of said second transmission lines being determined such that necessary capacitance is provided.

7. A push-push oscillator as claimed in claim 1, wherein said transmission line has a straight line portion including a virtual ground point of said transmission line and said antiphase combining means comprises a second strip line arranged in parallel to said straight line portion, said second strip line being arranged such that said virtual ground divides said second strip line into two portions having electrical lengths which are equal to each other.

8. A push-push oscillator as claimed in claim 1, wherein said in-phase combining means comprises second and third transmission lines, each of said second and third transmission lines having the same electrical length and the same impedance, one end of said second transmission line receiving said first output, one end of said third transmission line receiving said second output, the other ends of said second and third transmission lines being connected to each other.

9. A push-push oscillator as claimed in claim 1, wherein said in-phase combining means comprises first and second capacitors, each of said first and second capacitors having the same capacitance, one end of said first capacitor receiving said first output, one end of said second capacitor receiving said second output, the other ends of said first and second capacitors being connected to each other.

10. A push-push oscillator as claimed in claim 1, wherein said oscillating means comprises two equal oscillators arranged symmetrically.

11. A push-push oscillator comprising:
(a) a resonator having a transmission line and a capacitance connected to said transmission line in parallel;
(b) oscillating means responsive to said resonator for oscillating and for producing first and second outputs having an antiphase relation therebetween;
(c) antiphase combining means responsive to said first and second outputs of said oscillating means for producing a differential signal in accordance with a difference between said first and second outputs; and
(d) in-phase combining means responsive to two components from said resonator having an antiphase relation for summing said two components.

12. A push-push oscillator as claimed in claim 11, wherein said antiphase combining means comprises a balanced to unbalanced converting circuit.

13. A push-push oscillator as claimed in claim 11, wherein said antiphase combining means comprises a rat race circuit.

14. A push-push oscillator as claimed in claim 11, wherein said antiphase combining means comprises second and third transmission lines whose electrical lengths have a phase difference of 180° therebetween at a resonance frequency of said resonator, said second and third transmission lines having the same impedance.

15. A push-push oscillator as claimed in claim 11, wherein said antiphase combining means comprises a differential amplifier.

16. A push-push oscillator as claimed in claim 11, wherein said in-phase combining means comprises two second transmission lines, each having the same electrical length and the same impedance, said two second transmission lines being connected to two output points of said resonator respectively, said two output points provided symmetrically with respect to a virtual ground of said resonator at the same electrical length from said virtual ground.

17. A push-push oscillator as claimed in claim 11, wherein said in-phase combining means comprises two capacitors, each having the same capacitance, one end of said capacitors being connected to two output points of said resonator respectively, said two output points provided symmetrically with respect to a virtual ground of said resonator at the same electrical length from said virtual ground.

18. A push-push oscillator as claimed in claim 11, wherein said oscillating means comprises two equal oscillators arranged symmetrically.

19. A push-push oscillator as claimed in claim 11, wherein said transmission line is curved to form an open loop.

20. A push-push oscillator as claimed in claim 11, wherein said transmission line comprises a strip line.

21. A push-push oscillator as claimed in claim 11, wherein said transmission line is made of a dielectric material and is curved to form an open loop.

22. A push-push oscillator as claimed in claim 11, wherein said capacitance comprises two second transmission lines, each connected to a different end of said transmission line, said two second transmission lines facing each other with a given distance therebetween, said distance and length of said second transmission lines being determined such that necessary capacitance is provided.

23. A push-push oscillator as claimed in claim 11, wherein said transmission line comprises a substantially U-shaped strip line and said capacitance comprises two second transmission lines formed to have larger width than said U-shaped strip line, each connected to a different end of said U-shaped strip line, said two second transmission lines facing each other with a given distance therebetween, said distance and length of said second transmission lines being determined such that necessary capacitance is provided.

* * * * *